United States Patent [19]
Ogawa et al.

[11] 3,994,758
[45] Nov. 30, 1976

[54] METHOD OF MANUFACTURING A SEMICONDUCTOR DEVICE HAVING CLOSELY SPACED ELECTRODES BY PERPENDICULAR PROJECTION

[75] Inventors: Masaki Ogawa; Masaoki Ishikawa, both of Tokyo, Japan

[73] Assignee: Nippon Electric Company, Ltd., Tokyo, Japan

[22] Filed: Mar. 13, 1974

[21] Appl. No.: 450,793

[30] Foreign Application Priority Data
Mar. 19, 1973 Japan.............................. 48-32135

[52] U.S. Cl.................................. 156/3; 29/578; 29/579; 29/591; 156/11; 156/13; 156/17; 156/18; 427/89
[51] Int. Cl.².................................. H01L 21/441
[58] Field of Search.............. 156/8, 11, 13, 17, 18, 156/3; 29/578, 579, 591; 117/212, 217; 427/89, 90, 309; 204/192 E

[56] References Cited
UNITED STATES PATENTS

| | | | |
|---|---|---|---|
| 3,244,555 | 4/1966 | Adam et al. | 156/17 |
| 3,498,833 | 3/1970 | Lehrer | 156/13 |
| 3,615,951 | 10/1971 | Franco et al. | 156/18 |
| 3,675,313 | 7/1972 | Driver et al. | 29/579 |
| 3,700,510 | 10/1972 | Keene et al. | 156/3 |
| 3,761,785 | 9/1973 | Pruniaux | 29/579 |
| 3,764,865 | 10/1973 | Napoli et al. | 29/579 |
| 3,823,352 | 7/1974 | Pruniaux et al. | 29/579 |
| 3,833,435 | 9/1974 | Logan et al. | 156/17 |
| 3,837,907 | 9/1974 | Berglund et al. | 156/17 |
| 3,894,895 | 7/1975 | Khandelwal | 156/17 |
| 3,898,353 | 8/1975 | Napoli et al. | 156/17 |
| 3,920,861 | 11/1975 | Dean | 156/17 |

*Primary Examiner*—Charles E. Van Horn
*Assistant Examiner*—J. W. Massie
*Attorney, Agent, or Firm*—Hopgood, Calimafde, Kalil, Blaustein & Lieberman

[57] ABSTRACT

A Shottky barrier gate field effect transistor is produced by etching a first conductive film formed on a semiconductor crystal surface using a mask to leave a first conductive film area smaller than the area of the mask and projecting a second conductive material on to the surface perpendicularly thereof. The second conductive film areas thus formed and the first conductive film area serve as the source and drain electrodes and the gate electrodes, respectively.

20 Claims, 17 Drawing Figures

3,994,758

METHOD OF MANUFACTURING A SEMICONDUCTOR DEVICE HAVING CLOSELY SPACED ELECTRODES BY PERPENDICULAR PROJECTION

BACKGROUND OF THE INVENTION

This invention relates to a method of manufacturing a semiconductor device having closely spaced electrodes. As an example and a preferred embodiment of a semiconductor device having closely spaced electrodes, a Shottky barrier gate field effect transistor will in general be referred to below.

A Shottky barrier gate field effect transistor comprises source and a electrodes formed on a surface of a semiconductor crystal and a gate electrode formed on the surface between the source and drain electrodes. In order to achieve the desired electrical characteristics, a Shottky barrier gate field effect transistor should have, in the first instance the shortest possible gate length. Secondly, the gate electrode should be of a sufficiently low resistance. Thirdly, the parasitic resistances and capacities between the source and gate electrodes and between the gate and drain electrodes should be as small as possible. For example, it is known that the highest frequency an n-type gallium arsenide Shottky barrier gate field effect transistor having a gate length of 1 micron is capable of producing is 40 GHz. The maximum frequency, however, is dependent on the parasitic factors, particularly the resistance of the gate electrode and the series parasitic resistance between the source and gate electrodes, rather than the intrinsic transistor parameters. The series parasitic resistance between the electrodes, in turn, depends on the distance between the electrodes. On the other hand, it has been found to be difficult to manufacture a Shottky barrier gate field effect transistor wherein the resistance of the gate electrode is sufficiently low, the gate length is about 2 microns or shorter, and the electrodes are spaced apart by 1 micron or less. In addition, it has been found to be difficult to render the gate length short and yet the resistance of the gate electrode low. Furthermore, the necessary registration of masks has proved troublesome.

SUMMARY OF THE INVENTION

It is therefore an object of the present invention to provide a method of manufacturing a semiconductor device having closely spaced electrodes.

It is another object of this invention to provide a method of manufacturing a semiconductor device having an electrode of very small dimensions.

It is still another object of this invention to provide a method of manufacturing a semiconductor device of the type described, wherein mask registration is unnecessary.

A method of manufacturing a semiconductor device having electrodes closely spaced on a surface of a semiconductor substrate generally includes the step of forming a first conductive film of at least one first conductive material on the surface. Further in accordance with this invention, the method comprises the steps of forming a mask on the first conductive film to cover a predetermined portion thereof, removing that portion of the first conductive film which is not covered by the mask and that portion of the first conductive film which lies on the periphery of the predetermined portion to leave a first conductive film area having a smaller area than the mask, and projecting a second conductive material towards the surface substantially perpendicularly thereof to form a second conductive film on the mask and on that portion of the surface which is exposed to the projected second conductive material leaving a narrow interelectrode area of the substrate surface to form a second conductive film area on the exposed surface portion. It is to be noted in this connection that the substrate may include the highly doped regions of a semiconductor wafer. Alternatively, the substrate may have a silicon dioxide layer disposed on a silicon wafer.

In the case of a Shottky barrier gate field effect transistor, the second conductive film is divided into two area segments disposed on different sides of the first conductive film area. The interelectrode is also divided into two interelectrode area segments disposed between the first conductive film area and the second conductive film segments, respectively. The first conductive film and the second conductive film segments serve as the gate electrode and the source and drain electrodes, respectively.

DESCRIPTION OF THE PREFERRED EMBODIMENTS

Figure 1A:
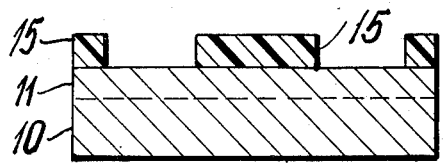
FIGS. 1(a) through 1(e) shown by cross-sectional view, the shows conventional steps of manufacturing a Shottky barrier gate field effect transistor.
Figure 1B:
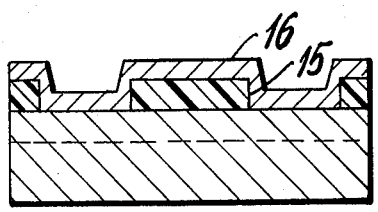
Figure 1C:
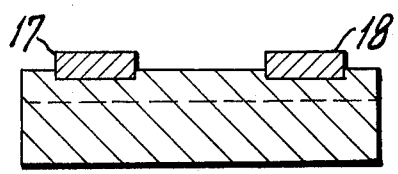
Figure 1D:
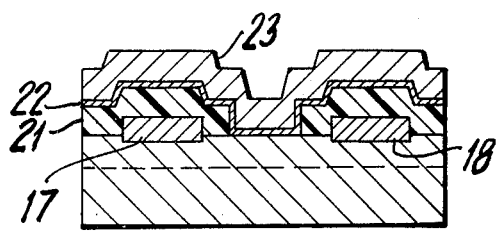
Figure 1E:
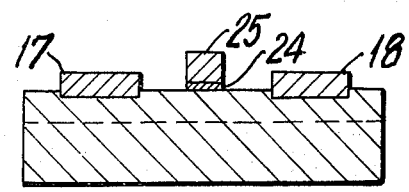

Referring at first to FIG. 1, a conventional method of manufacturing a Shottky barrier gate field effect transistor will be described in order to facilitate an understanding of the present invention. In FIG. 1 (a), a gallium arsenide crystal 10 has an n-type gallium arsenide crystal layer 11 of an electron density between 5 and 10 $\times 10^{16}$ cm$^{-3}$ and a thickness of about 0.3 micron epitaxially grown thereon. After being deposited on the exposed surface of the n-type crystal layer 11, a photoresist film is photoetched to leave a mask 15 exposing the source and drain electrode areas on the n-type crystal surface. In FIG. 1 (b), a source-drain electrode material, such as a gold-germanium alloy, is evaporated in a high vacuum onto the mask 15 and the n-type crystal surface to form a first conductive film 16 of a thickness of about 0.1 micron. After the mask 15 and the overlying first conductive film portions have been removed, the assembly is heat-treated in a hydrogen atmosphere to a temperature between 400° and 450° C to form source and drain electrodes 17 and 18 alloyed to the gallium arsenide as symbolically depicted in FIG. 1 (c). In FIG. 1 (d), the entire surface is coated with another photoresist film, which is also photo-etched to leave another mask 21 exposing a gate electrode area. A gate electrode metal, such as chromium, capable of forming a Shottky barrier with the n-type gallium arsenide crystal layer 11, is evaorated onto the latter or the second mask 21 and the exposed gate electrode area of the n-type crystal surface to form a gate electrode metal film 22 of a thickness of about 0.05 micron. Thereafter, another metal, such as gold, is evaporated onto the gate electrode metal film 22 to form a contact metal film 23 of a thickness of about 0.3 micron. In FIG. 1 (e), the second mask 21 is removed together with the gate electrode and contact metal films 22 and 23 formed on the second mask 21 to leave a gate electrode 24 and a contact 25 thereto.

With this conventional method, it is not impossible to manufacture a Shottky barrier gate field effect transistor having a gate length of 1 micron. It is, however, impossible in this case to form a contact metal film 23 thicker than 0.3 micron to reduce the resistance of the ohmic contact to the gate electrode 24 because the second mask 21 therefor must be thicker than 0.5 micron while the second mask 21 must be thinner than 0.5 micron in order to precisely remove the photoresist film by photoetching to provide a gate electrode area of a length of 1 micron. In addition, the second mask 21 must be in exact registration with the first mask 15. The precision of the registration attainable by photoetching can not render, a distance between the gate electrode 24 and the source and drain electrode 17 and 18 of less than 1 micron. With a Shottky barrier gate field effect transistor of a gate length of 1 micron and a gate width of 500 microns manufactured in accordance with the above-described conventional method, the equivalent resistance of the intrinsic transistor was 3.5 ohms, the series resistance between the source and gate electrodes was 5.5 ohms, the resistance of the gate electrode 24 was 5.0 ohms, and the highest possible frequency produced was 30 GHz, whereas the theoretical highest possible frequency as calculated was 100 GHz.

Figure 2A:
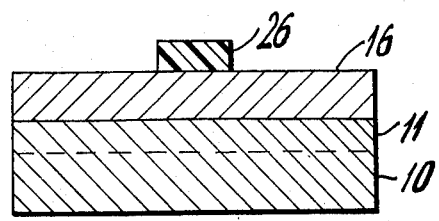
FIGS. 2(a) through 2(d) show, by cross-sectional views, shows steps of a method the, according to a first embodiment of this invention, for making a Shottky barrier gate field effect transistor.
Figure 2B:
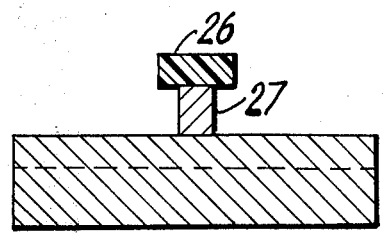
Figure 2C:
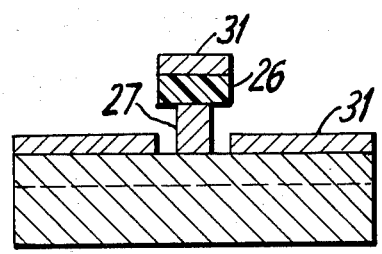
Figure 2D:
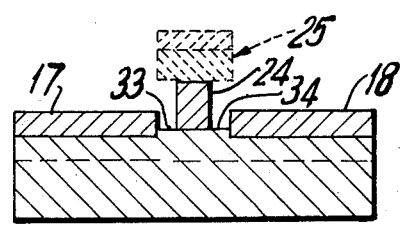

Referring now to FIG. 2, a description will be made of a method of manufacturing a Shottky barrier gate field effect transistor according to a first embodiment of the present invention. In FIG. 2 (a), a gallium arsenide crystal 10 has an n-type gallium arsenide crystal layer 11 of an electron density between 5 and $10 \times 10^{16}$ cm$^{-3}$ and a thickness of about 0.3 micron epitaxially grown thereon. A first conductive material, such as highly pure aluminium or gold, capable of forming a Shottky barrier with the n-type gallium arsenide and affording excellent bonding of a lead wire thereto is deposited on the entire surface of the n-type crystal layer 11 at a rate of about 0.1 micron per minute in a vacuum of about $1 \times 10^{-7}$ Torr using electron beam evaporation or resistive heating evaporation to form a first conductive film 16 of a thickness of from 0.5 to 0.6 micron. A mask 26 having a length of 2 microns is formed on the first conductive film 16 to cover a predeterined portion thereof. In FIG. 2 (b), the first conductive film 16 is removed at that portion which is not covered by the mask 26 and that portion which lies in the periphery of the predetermined portion to leave a first conductive film area 27 having a smaller area than the mask 26. For conductive film 16, the removal may be carried out by the use of an aqueous solution of phosphoric acid at a temperature of 50° C for 3 minutes to leave a first conductive film area 27 of a length of 1 micron. A similar first conductive film area 27 may be left by subjecting to chemical corrosion the peripheral portion of the predetermined portion having the first conductive film 16 covered by a mask of a length of 3 microns. It has been confirmed that it is possible to precisely control the chemical corrosion and to provide a long and narrow first conductive area 27 without any break or snapping therein. For example, even a 1-micron thick aluminium film 16 is removable with a precision of 0.1 micron. Furthermore, it is possible to provide by the use of a mask 26 of a width (measured in the direction of the gate length) of 2 microns and a length of 400 microns, an aluminium film area 27 of a width (gate length) of 0.5 micron without any defects. It is possible to remove the above-mentioned portions of the first conductive film 16 which is not covered by the mask 26 with excellent results by resorting to either ion milling described, for example, by E. G. Spencer and P. H. Schmidt in "The Journal of Vacuum Science and Technology," Volume 8, No. 5, pages S52 through S70, under the title of "Ionn-Beam Techniques for Device Fabrication," or to sputter etching described, for example, by P. D. Davidse in "J. Electrochem. Soc., Solid State Science," January 1969 issue, pages 100 through 103, under the title of "RF Sputter Etching — A Universal Etch," or by Larry L. Fritz in "Solid State Technology," December 1971 issue, pages 43 through 48, under the title of "Sputter Etch Removal Rates of Insulators, Semiconductors, and Conductors."

In FIG. 2 (c), the exposed surface of the n-type crystal layer 11 is chemically cleaned. Immediately thereafter, a second conductive material, such as a gold-germanium alloy which may include nickel, is projected either by evaporation or sputtering towards the n-type crystal surface substantially perpendicularly thereof to form a second conductive film 31 of a thickness of about 0.1 micron on the mask 26 and on that portion of the cleaned crystal surface which is exposed to the projected second conductive material to leave a narrow interelectrode area of the crystal surface. In FIG. 2 (d), the mask 26 is removed by the use of a solvent together with that portion of the second conductive film 31 which lies on the mask 26 to leave a second conductive film area deposited on the cleaned crystal surface. In the example being illustrated, the second conductive film area is divided into two area segments disposed on both sides of the first conductive area 27. The interelectrode area is also divided into two interelectrode segments 33 and 34 disposed between the first conductive film area 27 and the second conductive film segments, respectively. The assembly is heat-treated in a hydrogen atmosphere at a temperature between 400° and 450° C for about one minute to form source and drain electrodes 17 and 18 alloyed to the n-type gallium arsenide as symbolically illustrated and to make the first conductive film area 27 tenaciously adhere to the n-type crystal layer 11 as a gate electrode 24. The first conductive film area 27 serves here as the gate electrode 24 rather than as the source and drain electrodes 17 and 18 as in a Shottky barrier gate field effect transistor manufactured in accordance with a conventional method. It should also be mentioned that only one mask 26 is used so that registration of two conventional masks 15 and 21 is unnecessary according to the first embodiment of this invention.

In a modification of the first embodiment, the mask 26 which has been assumed to be a photoresist film may be a metal mask. The metal may be hafnium, molybdenum, or chromium. In the case of a metal mask 26, the mask 26 and the overlying portion of the second film 31 need not be removed but may be left to serve as a contact 25 to the gate electrode 24 as depicted in FIG. 2 (d) with dashed lines.

Figure 3A:
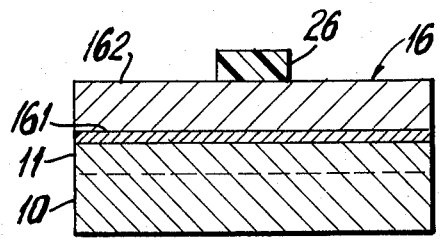
FIGS. 3(a) through 3(d) similarly show the similarly shows steps of a method according to a second embodiment of this invention.
Figure 3B:
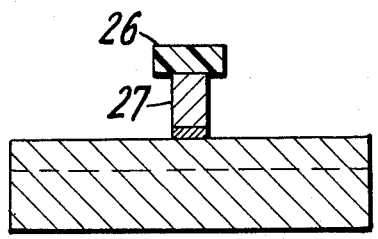
Figure 3C:
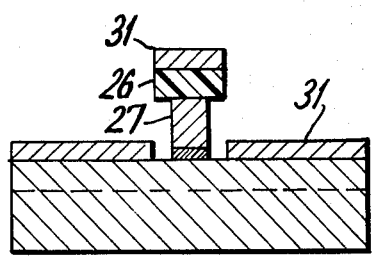
Figure 3D:
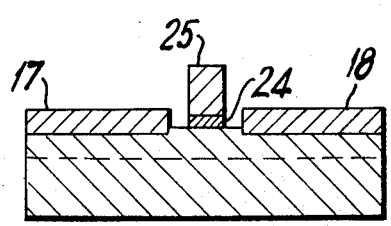

Referring to FIG. 3 wherein similar components are designated with like reference numerals as in FIG. 2, a method will be described for manufacturing a Shottky barrier gate field effect transistor in accordance with a second embodiment of this invention. In FIG. 3 (a), the first conductive film 16 comprises a first layer 161 formed on the n-type crystal layer 11 of a metal, such as molybdenum or hafnium, capable of forming a Shottky barrier with the n-type gallium arsenide and a second layer 162 formed on the first layer 161 of a metal, such as gold, highly conductive and capable of affording excellent bonding of a lead wire thereto. In FIG. 2 (b), the second and first layers 162 and 161 are chemically removed successively by the use of the mask 26 to leave a first conductive film area 27. FIGS. 3 (c) and (d) will be self-explanatory when compared with FIGS. 2 (c) and (d).

Figure 4A:
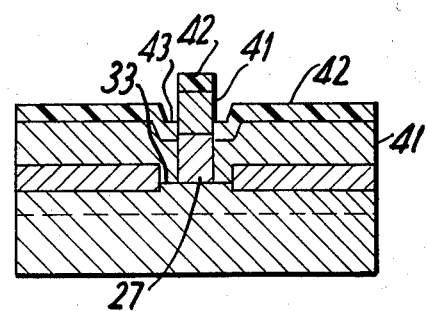
FIGS. 4(a) through 4(d) shows the steps of a method according to a third embodiment of this invention, when considered in connection with FIG. 2.
Figure 4B:
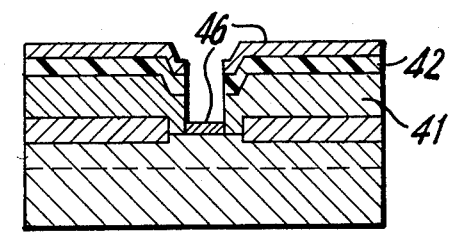
Figure 4C:
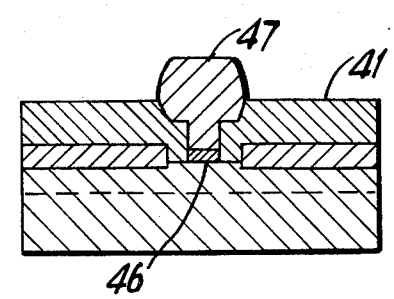
Figure 4D:
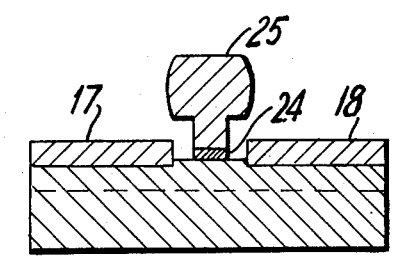

Referring finally to FIG. 4, a method will be described of manufacturing a Shottky barrier gate field effect transistor in accordance with a third embodiment of this invention. The first steps of the method according to the third embodiment are similar to the steps illustrated with reference to FIG. 2 of the first embodiment. In FIG. 4 (a), a first masking material, such as hafnium, resistant to a first corrosive agent, such as an aqueous solution of phosphoric acid, for the first conductive material of the first conductive film 16 and also to a second corrosive agent, such as hydrochloric acid, but susceptible to a third corrosive agent, such as hydrofluoric acid, is deposited on the first conductive film area 27, the second conductive film area, and the interelectrode area, such as 33, to form a first masking film 41 of a thickness of 0.4 micron. Thereafter, a second masking material, such as chromium, resistant to the first corrosive agent but susceptible to the second corrosive agent, is deposited on the first masking film 41 to form a second masking film 42 of a thickness of 0.15 micron. The first and second masking films 41 and 42 become recessed at those respective portions thereof which overlie the interelectrode area 33 as shown at 43. In FIG. 4 (b), the first conductive film area 27 is removed by the use of the first corrosive agent together with those respective portions of the first and second masking films 41 and 42 which overlie the first conductive film area 27. Subsequently, a third conductive material, such as platinum, resistant to the second corrosive agent and capable of forming a Shottky barrier with the n-type gallium arsenide, is evaporated to form a third conductive film 46 of a thickness of 0.05 micron on those respective portions of the second masking film 42 and the crystal surface which are left exposed after the first conductive film area removing step. In FIG. 4 (c), the remaining second masking film 42 is removed by the use of the second corrosive agent together with that portion of the third conductive film 46 which lies on the remaining second masking film portion. Thereafter, a fourth conductive material, such as gold, capable of affording excellent bonding to a lead wire is plated on to the remaining area of the third conductive film 46 to form a fourth conductive film 47 of a thickness of 1 micron. The first masking material should be such that the fourth conductive material is not plated on to the first masking film 41. In connection with the plating step, it is worthwhile to note that the fourth conductive film 47, when plated thicker than the first masking film 41, extends sideways to lie on that portion of the first masking film 41 which became recessed, whereby the fourth conductive film 47 is formed in the general shape of a mushroom in cross section. In FIG. 4 (d), the first masking film 41 is removed by the use of the third corrosive agent. The remaining third conductive film area and the fourth conductive film 47 provide a gate electrode 24 and a contact 25 thereto. It is thus possible to automatically bring the first and second masking films 41 and 42 into registration with the gate electrode area.

In a modification of the third embodiment, the first masking material may be a dielectric material resistant to the first and second corrosive agents. The first masking film 41 remaining after the fourth conductive film forming step need not be removed by the use of the third corrosive agent but may be left to serve as a passivation layer for the Shottky barrier gate field effect transistor.

A Shottky barrier gate field effect transistor manufactured in accordance with the modification of the third embodiment had a equivalent inherent resistance of 3.5 ohms, a series resistance of 3.0 ohms between the source and gate electrodes, and a resistance of 0.5 ohm for the gate electrode. The highest frequency produced was 80 GHz.

While several exemplary embodiments of this invention and modifications thereof have thus far been described, it is also possible to manufacture a Shottky barrier gate field effect transistor or to simultaneously manufacture a plurality of such transistors in accordance with this invention by the use of a silicon crystal, a mixed crystal of indium, arsenic, and phosphorous, or a mixed crystal of indium, gallium, and phosphorus. In addition, this invention is applicable to other semiconductor devices having closely spaced electrodes. For example, a charge coupled semiconductor device may be manufactured by forming a first conductive film of a conductive material on the surface of a substrate, forming a plurality of equally spaced mask segments on the first conductive film, removing those portions of the first conductive film which are not covered by the mask segments and which are contiguous to the first-mentioned portions, projecting the conductive material towards the substrate surface substantially perpendicularly thereto to form a second conductive film on the mask segments and on those portions of the substrate surface which are exposed to the projected conductive material leaving narrow interelectrode areas, and removing the mask segments together with the second conductive film portions formed thereon. The first and second conductive film areas remaining on the substrate surface serve as the electrodes of the charge coupled semiconductor device.

The above description of exemplary embodiments of the invention should not be thought of as limiting the scope of the invention, and numerous variations in addition to those mentioned herein will occur to persons skilled in the art.

What is claimed is:

1. A method of manufacturing a semiconductor device having closely spaced electrodes on a surface of a semiconductor substrate, comprising the steps of forming a first conductive film of a first conductive material on said surface, forming a mask on said first conductive film to cover a predetermined portion thereof, removing by a chemical etch that portion of said first conductive film which is not covered by said mask and that portion of said first conductive film which lies in the periphery of said predetermined portion to leave a first conductive film area having an area smaller than said mask, projecting a second conductive material toward said surface substantially perpendicular thereof to form a second conductive film on said mask and on that portion of said surface which is exposed to the projected second conductive material thereby leaving a narrow interelectrode area of the surface of said substrate to form a second conductive film area deposited on said exposed surface portion, removing said mask and that portion of said second conductive film which lies on said mask to leave said conductive material film area on said exposed surface portion, forming a first masking film of a first masking material resistant to first and second corrosive agents on said first and second conductive film areas and on said interelectrode area, forming a second masking film of a second masking material resistant to said first corrosive agent but susceptible to said second corrosive agent on said first masking film, removing portions of said first and second masking films that overlie said first conductive film area, removing said first conductive film area by the use of said first corrosive agent forming a third conductive film of a third conductive material resistant to said second corrosive agent on those portions of said second masking film and said surface which remain exposed after said first conductive film area removing step, removing the remaining second masking film portion together with that portion of said third conductive film which lies on said remaining second masking film portion by the use of said second corrosive agent, and forming a fourth conductive film of a fourth conductive material on the remaining area of said third conductive film and on that portion of said first masking film which is recessed, said first masking material being rejective of formation of said fourth conductive film on said first masking film, whereby said fourth conductive film is formed in the general shape of a mushroom in cross section.

2. The method of claim 1 wherein said first masking material is susceptible to a third corrosive agent to which said third and fourth conductive materials are resistant, said method further comprising the step of removing said first masking film by the use of said third corrosive agent after said fourth conductive film forming step.

3. The method of claim 1, wherein said semiconductor device is a Shottky barrier gate field effect transistor, said second conductive film area being divided into two segments disposed on different sides of said third conductive film area, said interelectrode area being divided into interelectrode segments disposed between said third conductive film area and said second conductive film segments, respectively, said third conductive film area and said fourth connductive film thereby forming a gate and said second conductive film segments thereby forming source and drain electrodes.

4. The method of claim 3, wherein said first conductive material is aluminum, said second conductive material is a gold-germanium alloy, said third conductive material is platinum, said fourth conductive material is gold, said first masking material is hafnium, said second masking material is chromium, said first corrosive agent is an aqueous solution of phosphoric acid, said second corrosive agent is hydrochloric acid, and said third corrosive agent is hydrofluoric acid.

5. A method of manufacturing a semiconductor device including a semiconductor substrate having a planar surface, a first piece substantially of aluminum on said planar surface, and second piece means of a conductive material on said planar surface, said first piece having a predetermined width at its portion contiguous to said planar surface, said second piece means being disposed with a space left between said first piece and said second piece means on said planar surface, said method comprising the steps of forming a first film essentially of aluminum on said planar surface, forming a mask of a width at least twice as wide as said predetermined width on said first film, removing by a chemical etch that portion of said first film which is not covered by said mask and that portion of said first film which lies under said mask to a controlled width at least along said planar surface from an interface between the uncovered portion of said first film and the portion underlying said mask to leave said first piece, and projecting said conductive material toward said planar surface substantially perpendicularly thereof to form a second film on said mask and that portion of said planar surface which is exposed to said projected conductive material, thereby forming said space on said exposed surface to form said second piece means deposited on said exposed planar surface portion.

6. The method of claim 5, further comprising the step of removing, after said conductive material projecting step, said mask and that portion of said second film which lies on said mask to leave said second piece means on said exposed planar surface portion.

7. The method of claim 6, wherein said first piece and said second piece means are electrodes and said space is an interelectrode area.

8. The method of claim 7, wherein said semiconductor device is a Shottky barrier gate field effect transistor, said second piece means being divided into two segments disposed on different sides of said first piece, said interelectrode area being divided into two interelectrode area segments disposed between said first piece and said second piece segments, respectively, said conductive material providing ohmic contact between said second piece segments and said semiconductor substrate, said first piece and said second piece segments thereby forming gate electrode and source and drain electrodes, respectively.

9. The method of claim 8, wherein said semiconductor substrate is essentially of gallium arsenide and said second piece segments are of gold-germanium.

10. The method of claim 8, wherein said semiconductor substrate is essentially of gallium arsenide and said second piece segments are of gold-germanium and platinum.

11. The method of claim 6, further comprising the steps of forming, subsequent to said mask and second film removing step, a first masking film of a first masking material resistant to first and second corrosive agents on said first piece and second piece means and on said space, forming a second masking film of a second masking material resistant to said first corrosive agent but susceptible to said second corrosive agent on said first masking film, removing portions of said first and second masking films which overlie said first piece, removing said first piece by the use of said first corrosive agent, forming a third film of a second conductive material resistant to said second corrosive agent on those portions of said masking film and said surface which remain exposed after said first piece removing step, removing the remaining second masking film portion together with that portion of said third film which lies on said remaining second masking film portion by the use of said second corrosive agent, and forming a fourth film of a third conductive material on the remaining area of said third film and on that portion of said first masking film which is recessed, said first masking material being rejective of formation of said fourth film on said first masking film, whereby said fourth film on said remaining area is formed in the general shape of a mushroom in cross section.

12. The method of claim 11, wherein said first masking material is susceptible to a third corrosive agent to which said second and third conductive materials are resistant, said method further comprising the step of removing said first masking film by the use of said third corrosive agent after said fourth film forming step.

13. The method of claim 12, wherein said second piece means and said third film remaining area and said fourth film are electrodes and said space is an interelectrode area.

14. The method of claim 13, wherein said semiconductor device is a Shottky barrier gate field effect transistor, said second piece means being divided into two segments disposed on different sides of said third film remaining area, said interelectrode area being divided into interelectrode area segments disposed between said third film remaining area and said second piece segments, respectively, said third film remaining area and said fourth film thereby forming a gate and said second piece segments thereby forming source and drain electrodes.

15. A method of manufacturing a Schottky barrier gate field-effect transistor comprising the steps of forming a first film of a first metal on a surface of a semiconductor body, said first metal being capable of forming a Schottky barrier with said semiconductor body, forming a mask of a predetermined width on said first film, removing said first film to a portion thereof which lies under said mask by one of chemical etching, ion milling, and sputter etching to form a gate electrode of said first metal, and depositing a layer of a second metal on the uncovered portions of said surface, said second metal being capable of forming an ohmic contact with said semiconductor body, thereby forming a source and a drain electrode of said second metal.

16. A method of manufacturing a Schottky barrier gate field effect transistor including a semiconductor body having a planar surface, a gate electrode having a predetermined width, and a source and a drain electrode on said planar surface on both sides of said gate electrode with a space left therebetween, said method comprising the steps of forming a first film of a first metal capable of forming a Schottky barrier with said semiconductor body on said planar surface, forming a mask of a width at least twice as wide as said predetermined width on said first film, removing that portion of said first film which is not covered by said mask by one of chemical etching, ion milling, and sputter etching, undercutting those portions of said first film which underlie said mask by chemical etching to leave said gate electrode having said predetermined width on said planar surface, and projecting a second metal capable of forming an ohmic contact with said semiconductor body toward said planar surface substantially perpendicularly thereto to form a second film on said planar surface which is exposed to said projected metal, thereby forming said space on said exposed surface to form said source and drain electrodes deposited on said exposed planar surface portion.

17. The method of claim 16, further comprising the step of removing, after said second metal projecting step, said mask and that portion of said second film which lies on said mask while leaving said source and drain electrodes on said exposed planar surface portion.

18. The method of claim 17, wherein said semiconductor substrate is essentially of gallium arsenide, said first metal is aluminum, and said second metal is a gold-germanium alloy.

19. A method of manufacturing a Schottky barrier field-effect transistor comprising the steps of forming a semiconductor layer on a substrate, forming a first film of a first metal on the surface of a semiconductor layer, said first metal being capable of forming a Schottky barrier with said semiconductor body, forming a mask of a predetermined width on said first film, removing said first film to a portion thereof which lies under said mask by one of chemical etching, ion milling, and sputter etching to form a gate electrode of said first metal, and depositing a layer of a second metal on uncovered portions of said surface, said second metal being capable of forming an ohmic contact with said semiconductor layer, thereby forming a source and a drain electrode of said second metal.

20. A method of manufacturing a Schottky barrier gate field effect transistor including a semiconductor body having a planar surface, a gate electrode having a predetermined width on said planar surface, and a source and a drain electrode also on said planar surface on both sides of said gate electrode with a space left between said gate electrode and each of said source and drain electrodes, said method comprising the steps of (a) forming a first film of a first metal capable of forming a Schottky barrier with said semiconductor body on said planar surface, (b) forming a mask of a width at least twice as wide as said predetermined width on said first film, (c) etching said first film to remove that portion thereof which is not masked by said mask and each of those portions thereof which underlie said mask to a controlled width with a portion of said first film left as said gate electrode between the underlying portions and to uncover areas of said planar surface on both sides of said gate electrode, said etching being carried out chemically at least in etching said underlying portions, (d) projecting a second metal capable of forming an ohmic contact with said semiconductor body toward said planar surface substantially perpendicularly thereof to form a second film on said mask and those portions of the uncovered areas of said planar surface which are exposed to the projected second metal, thereby forming a pair of second film portions on said uncovered areas with said space of said controlled width left between said gate electrode and each of said second film portions, and (e) adapting said second film portions for use as said source and drain electrodes.

* * * * *

UNITED STATES PATENT OFFICE
CERTIFICATE OF CORRECTION

Patent No. 3,994,758　　　　　　　　　　Dated　November 30, 1976

Inventor(s)　Masaki Ogawa and Masaoki Ishikawa

It is certified that error appears in the above-identified patent and that said Letters Patent are hereby corrected as shown below:

Claim 11, line 62, after "said" insert -- second --.

Signed and Sealed this

Eighth Day of February 1977

[SEAL]

Attest:

RUTH C. MASON
Attesting Officer

C. MARSHALL DANN
Commissioner of Patents and Trademarks